(12) United States Patent
Nosowitz et al.

(10) Patent No.: US 6,911,393 B2
(45) Date of Patent: Jun. 28, 2005

(54) COMPOSITION AND METHOD FOR COPPER CHEMICAL MECHANICAL PLANARIZATION

(75) Inventors: Martin Nosowitz, Paoli, PA (US); Nicholas M. Martyak, Doylestown, PA (US); Glenn Carroll, Norristown, PA (US); Patrick K. Janney, Ridley Park, PA (US)

(73) Assignee: Arkema Inc., Philadelphia, PA (US)

( * ) Notice: Subject to any disclaimer, the term of this patent is extended or adjusted under 35 U.S.C. 154(b) by 69 days.

(21) Appl. No.: 10/706,178

(22) Filed: Nov. 12, 2003

(65) Prior Publication Data

US 2004/0116313 A1 Jun. 17, 2004

Related U.S. Application Data

(60) Provisional application No. 60/430,418, filed on Dec. 2, 2002.

(51) Int. Cl.[7] .............................................. H01L 21/44
(52) U.S. Cl. ...................... 438/678; 438/692; 438/745; 510/175; 510/176; 252/79.1
(58) Field of Search ................................ 438/678, 584, 438/692, 697, 758, 618, 745, 622, 677, 687; 510/175, 176; 252/79.1

(56) References Cited

U.S. PATENT DOCUMENTS

| 4,116,699 | A | * | 9/1978 | Rooney ..................... 252/79.4 |
| 4,233,112 | A | | 11/1980 | Valayil et al. |
| 5,073,577 | A | | 12/1991 | Anderson |
| 5,177,908 | A | | 1/1993 | Tuttle |
| 5,230,184 | A | | 7/1993 | Bukhman |
| 5,234,867 | A | | 8/1993 | Schultz et al. |
| 5,245,790 | A | | 9/1993 | Jerbic |
| 5,297,364 | A | | 3/1994 | Tuttle |
| 5,486,129 | A | | 1/1996 | Sandhu et al. |
| 5,562,530 | A | | 10/1996 | Runnels et al. |
| 5,953,628 | A | * | 9/1999 | Kawaguchi ................. 438/635 |
| 6,068,879 | A | | 5/2000 | Pasch |
| 6,117,783 | A | | 9/2000 | Small et al. |
| 6,117,795 | A | | 9/2000 | Pasch |
| 6,709,979 | B2 | * | 3/2004 | Komai et al. ............... 438/678 |

FOREIGN PATENT DOCUMENTS

| WO | WO/9711484 | 3/1997 |
| WO | WO/0112741 | 2/2001 |
| WO | WO/01/44396 | 6/2001 |

OTHER PUBLICATIONS

U.S. Appl. No. 09/091,932, filed Jun. 24, 1998, Kaisaki et al.
Production of Sulfide Minerals by Sulfate–Reducing Bacteria During Microbiologically Influenced Corrosion of Copper, McNeil, Jones, and Little.

* cited by examiner

Primary Examiner—Gregory Webb
(74) Attorney, Agent, or Firm—Gilbert W. Rudman

(57) ABSTRACT

A family of slurries are disclosed which are useful in modifying exposed surfaces of wafers for semiconductor fabrication are provided along with methods of modifying exposed surfaces of wafers for semiconductor fabrication utilizing such a family of working slurries, and semiconductor wafers. The slurries of the invention are comprised of a liquid carrier; a sulfur-bearing compounds capable of converting copper to copper sulfide; optionally, abrasive particles (polishing agent; optionally a chelating agent; optionally a buffering agent; optionally, a stopping compound; optionally, other additives; and optionally, a co-solvent. The method of the invention comprises the steps of: a) providing a wafer comprising a first material having a surface etched to form a pattern and a second material deposited over the surface of the first material; b) contacting the second material of the wafer with abrasive in the presence of the working slurry; and c) relatively moving the wafer or polishing pad or both while the second material is in contact with the slurry and abrasive particles until an exposed surface of the wafer is planar and comprises at least one area of exposed first material and one area of exposed second material.

17 Claims, No Drawings

COMPOSITION AND METHOD FOR COPPER CHEMICAL MECHANICAL PLANARIZATION

REFERENCE TO RELATED APPLICATIONS

This application claims the benefit of U.S. Provisional Application Ser. No. 60/430,418, filed Dec. 2, 2002.

BACKGROUND OF THE INVENTION

1. Field of the Invention

This invention relates to an improved composition of slurries and a process for the chemical mechanical polishing or planarization of semiconductor wafers. More specifically, it relates to compositions of slurries containing sulfur-bearing compounds capable of converting copper to copper sulfide that are employed in the polishing of silicon wafers used to produce semiconductor chips.

2. Discussion of the Prior Art

During integrated circuit manufacture, semiconductor wafers used in semiconductor fabrication typically undergo numerous processing steps, including deposition, patterning, and etching steps.

Details of these manufacturing steps for semiconductor wafers are reported by Tonshoff et al., "Abrasive Machining of Silicon", published in the *Annals of the International Institution for Production Engineering Research*, (Volume 39/2/1990), pp. 621–635. In each manufacturing step, it is often necessary or desirable to modify or refine an exposed surface of the wafer in order to prepare the wafer for subsequent fabrication or manufacturing steps.

In conventional semiconductor device fabrication schemes, a silicon wafer is subjected to a numerous processing steps that deposit uniform layers of two or more discrete materials which together form a single layer of what will become a multi-layer structure. In this process, it is common to apply a uniform layer of a first material to the wafer itself or to an existing layer of an intermediate construct by any of the means commonly employed in the art, to etch pits into or through that layer, and then to fill the pits with a second material. Alternatively, features of approximately uniform thickness comprising a first material may be deposited onto the wafer, or onto a previously fabricated layer of the wafer, usually through a mask, and then the regions adjacent to those features may be filled with a second material to complete the layer. Following the deposition step, the deposited material or layer on a wafer surface generally needs further processing before additional deposition or subsequent processing occurs. When completed, the outer surface is substantially globally planar and parallel to the base silicon wafer surface. A specific example of such a process is the metal Damascene processes.

In the Damascene process, a pattern is etched into an oxide dielectric (e.g., $SiO_2$) layer. After etching, optional adhesion and or barrier layers are deposited over the oxide surface. Typical barrier layers may include tantalum, tantalum nitride, titanium nitride or titanium, or tungsten. Next, a metal (e.g., copper) is deposited over or on top of the adhesion and or barrier layers. The copper metal layer is then modified, refined or finished by removing the copper metal and regions of the adhesion and or barrier layer on the surface of the underlying dielectric. Typically, enough surface metal is removed so that the outer exposed surface of the wafer comprises both metal and an oxide dielectric material. A top view of the exposed wafer surface would reveal a planar surface with copper metal corresponding to the etched pattern and dielectric material adjacent to the copper metal. The copper (or other metal) and oxide dielectric material(s) located on the modified surface of the wafer inherently have different hardness values and susceptibly to controlled corrosion. The method to modify the surface of the semiconductor may be a combination of a physical and chemical process. Such a process is called chemical mechanical planarization (CMP). An abrasive CMP process used to modify a wafer produced by the Damascene process must be engineered to simultaneously modify the metal (e.g., copper) and dielectric materials without scratching the surface of either material. The abrasive process must create a planar outer exposed surface on a wafer having an exposed area of a metal and an exposed area of a dielectric material.

Chemical mechanical polishing (or planarization) (CMP) is an area in semiconductor processing undergoing rapid changes. CMP provides global (millimeter-sized dimensions) and local (micron to nanoscale-sized) planarization on the wafer surface. This planarity improves the coverage of the wafer with dielectric materials and metals (e.g., copper) and increases lithography, etching and deposition process latitudes. Various equipment companies are advancing CMP technology through improvements in the engineering aspects of CMP while chemical companies are focusing on consumables such as slurries and polishing pads. For example, conventional CMP methods for modifying or refining exposed surfaces of structured wafers uses techniques that polish a wafer surface with a slurry containing a plurality of loose abrasive particles dispersed in an aqueous medium. Typically this slurry is applied to a polishing pad and the wafer surface is then ground or moved against the pad in order to remove the desired material from the wafer surface. Generally, the slurry may also contain chemical agents that react with the wafer surface.

A relatively new alternative to CMP slurry methods uses an abrasive pad to planarize a semiconductor surface and thereby eliminate the need for the foregoing slurries containing polishing particles.

This alternative CMP process is reported in International Publication No. WO 97/11484, published Mar. 27, 1997. The abrasive pad has a textured abrasive surface that includes abrasive particles dispersed in a binder. During polishing, the abrasive pad is contacted with a semiconductor wafer surface, often in the presence of a working slurry containing no additional abrasive particles, with a motion adapted to modify a single layer of material on the wafer and thus provides a planar, uniform wafer surface. The working slurry is applied to the surface of the wafer to chemically modify or otherwise facilitate the removal of a material from the surface of the wafer under the action of the abrasive article.

Working slurries of the prior art useful in the process described above, either in conjunction with the aforementioned slurries or the abrasive pad, are typically aqueous slurries of a variety of additives including complexing agents, oxidizing agents, passivating agents, surfactants, wetting agents, buffers, viscosity modifiers or combinations of these additives. Additives may also Include agents that are reactive with the second material, e.g., metal or metal alloy conductors on the wafer surface such as oxidizing, reducing, passivating, or complexing agents. Examples of such working slurries may be found, for example, in U.S. patent application Ser. No. 09/091,932 filed Jun. 24, 1998.

Variables that may affect wafer CMP processing include the selection of the appropriate contact pressure between the wafer surface and abrasive article, type of slurry medium, relative speed and relative motion between the wafer surface and the abrasive article, and the flow rate of the slurry medium. These variables are interdependent, and are selected based upon the individual wafer surface being processed.

CMP processes for modifying the deposited metal layer until the barrier layer or oxide dielectric material is exposed on the wafer outer surface leaves little margin for error because of the sub-micron dimensions of the metal features found on the wafer surface. The removal rate of the deposited metal should be relatively fast to minimize the need for additional expensive CMP tools, and the metal must be completely removed from the areas that were not etched. The metal remaining in the etched areas must be limited to discrete areas while being continuous within those areas or zones to ensure proper conductivity. In short, the metal modification process must be uniform, controlled, and reproducible on a sub-micron to nano-scale dimension.

In the CMP processes mentioned above, dishing performance, scratches or defects and removal rate of the metal are measurements of CMP performance. These performance measurements may depend on the use of the foregoing working slurries. Dishing is a measure of how much metal, such as copper, is removed from bond pads or wire traces below the plane of the intermediate wafer surface as defined by the difference in height between the copper and the tops of the barrier or dielectric layers following removal of the blanket copper or copper plus barrier layer. Removal rate refers to the amount of material removed per unit time. Removal rates greater than at least about 1000 A per minute are preferred. Lower removal rates, such as a few hundred angstroms per minute (A/min) or less, are less desirable because they tend to create increases in the overall manufacturing costs (cost of ownership) associated with wafer manufacture.

To minimize dishing and increase removal rates of layered surface materials on semiconductor devices, it is important to engineer slurries with components in narrow concentration ranges and pH values. The pH of the slurries used in polishing of semiconductor devices is dependent upon the composition of the surface layer to be polished. In most cases, it is necessary to engineer a slurry with a proper pH to effectively produce an oxide layered surface at the same rate the mechanical action of abrasion removes this layered oxide. For copper polishing slurries, U.S. Pat. No. 6,117,783 shows the importance of pH of about 6.0 to form a copper(I) oxide, $Cu_2O$. Cuprous oxide can form only in near-neutral to slightly basic media. In low pH slurries, a protective oxide may not form on the copper surface thus increasing the propensity for aggressive attack by the oxidizing agent on copper metal. In high pH slurries, removed copper may precipitate from solution resulting in un-wanted particulate matter adhering to the wafer surface. Therefore, copper-polishing slurries must be formulated within a narrow pH window to ensure a high yield after CMP.

Prior art related to CMP includes the following:

U.S. Pat. No. 4,233,112 (Dart Industries) in which Valayil and Elias disclose the use of polysulfides as catalysts for hydrogen peroxide, useful in accelerating the dissolution of copper from circuit boards. This early disclosure allowed extrapolation to removal of copper from wafers, the basis of much of the prior art.

Removal rate acceleration by sulfur compounds has been a major focus of many patent filings. In WO01/44396 (Rodel Holdings), Sachen et. al. described slurries containing mercaptans, disulfides and glycolates, which demonstrated accelerated copper removal rates. In WO01/12740 (Cabot Microelectronics), Wang et.al. also described organosulfur compounds as removal rate enhancing. In WO01/12741 (Cabot), Wang et.al. again described organosulfur corrosion accelerants in compositions also containing corrosion "stoppers".

U.S. Pat. No. 6,117,795 (LSI Logic), in which organosulfur compounds are discussed by Pasch as corrosion inhibitors for metal removal compositions. In U.S. Pat. No. 6,068,879, Pasch disclosed the utility of similar compounds in post-etch cleaners.

U.S. Pat. No. 5,073,577 (Morton International) in which Anderson discusses stable emulsions of high molecular weight polysulfides, which can be cured to produce sealants.

In *Production of Sulfide Minerals by Sulfate-Reducing Bacteria During Microbiologically Influenced Corrosion of Copper*, McNeil, Jones, and Uttle show that non-adherent layers of chalcocite (Cu2S) are formed on copper surfaces under some conditions. A Pourbaix diagram is published which details conditions under which copper sulfides and oxides are stable.

It would be desirable to provide improvements in chemical mechanical planarization by providing working slurries useful in modifying exposed intermediate copper surfaces of structured wafers for semiconductor fabrication and to methods of modifying the exposed copper intermediate surfaces of such wafers for semiconductor fabrication, preferably with improved, sustainable, copper removal rates and utilizing the foregoing family of working slurries. It would be especially desirable to provide working slurries that are more stable than commercially available slurries. It would also be desirable to provide working slurries that are useful in the aforementioned methods and resulting in the fabrication of copper containing structured wafers with better planarity and less defects.

SUMMARY OF THE INVENTION

The present invention is a slurry useful to modify exposed intermediate surfaces of structured wafers for semiconductor fabrication, a method of modifying exposed intermediate surfaces of structured wafers for semiconductor fabrication utilizing such a family of working slurries, and semiconductor wafers made according the foregoing process. The term slurry is used because it is familiar to one skilled in the art. However, for the present invention, the slurry may or may not contain abrasive polishing particles or any other solid not totally dissolved. Furthermore, the term slurry may only refer to sulfur-bearing compounds capable of converting copper to copper sulfide.

This invention is an improved composition of slurries and process for the chemical mechanical polishing or planarization of semiconductor wafers, in which the slurry is a composition containing a sulfur-bearing compounds capable of converting copper to copper sulfide for use in modifying or refining intermediate surfaces of structured wafers suited for semiconductor fabrication.

In one aspect, the invention provides a working slurry useful in modifying a copper surface of a wafer suited for fabrication of a semiconductor device, the slurry being comprised of:

a) a sulfur-bearing compounds capable of converting copper to copper sulfide b) optionally, a liquid carrier, c) optionally, an oxidizing agent, d) optionally, inorganic polishing particles,
e) optionally, a chelating agent,
f) optionally, a buffering agent
g) optionally, a passivating agent,
h) optionally, surfactants, emulsifying agents, viscosity modifiers, wetting agents, lubricants, soaps, and the like,
i) optionally, a stopping compound to increase metal polishing selectively, and
j) optionally a co-solvent.

Another embodiment of the invention is a method of modifying a surface of a wafer suited for fabrication of a semiconductor device comprising the steps of:

a) providing a wafer comprising a first material having a surface etched to form a pattern and a second material deposited over the surface of the first material;
b) contacting the second material of the wafer with polishing pad in the presence of the working slurry containing a sulfur-bearing compound capable of converting copper to copper sulfide; and
c) relatively moving the wafer or polishing pad while the second material is in contact with a polishing pad until an exposed surface of the wafer is planar and comprises at least one area of exposed first material and one area of exposed second material.

The invention also includes articles of manufacture that contain metal surfaces produced from slurries of this invention.

DETAILED DESCRIPTION OF THE INVENTION

The present invention teaches compositions useful for removal of copper and its alloys from surfaces such as those used In wafer fabrication. Also part of the invention is the use of said compositions in the process of Chemical Mechanical Planarization for manufacturing semiconductor wafers.

CMP slurries of the invention are characterized in significant part by containing a sulfur-bearing compound capable of converting copper to copper sulfide. Without being bound by theory, it is believed that the sulfur-bearing compounds capable of converting copper to copper sulfide can modulate the copper removal rate in the desired range to effectively promote copper (I) or copper(II) sulfide layer that is subsequently abraded from the surface of the electronic device. In addition, the sulfur-bearing compounds capable of converting copper to copper sulfide of this invention are characterized by producing an insoluble copper-sulfide complex which minimizes the propensity for copper deposition onto the back of the silicon device.

Compositions of the invention contain a sulfur-bearing compounds capable of converting copper to copper sulfide and optionally an aqueous, organic or mixed aqueous-organic liquid carrier optionally an oxidizing agent, optionally inorganic polishing particles, optionally a chelating agent, optionally a buffering agent, optionally a passivating agent, optionally surfactants, optionally viscosity modifiers, optionally wetting agents, optionally lubricants, optionally soaps, and the like.

As discussed above, solutions of the invention containing sulfur-bearing compounds capable of converting copper to copper sulfide are particularly effective in various CMP slurries to effectively remove copper and copper alloy layers, barrier layers and dielectrics found in electronic devices. In particular, slurries of this invention containing sulfur-bearing compounds capable of converting copper to copper sulfide are useful for the removal of copper on integrated circuits such as that produced in Damascene structures.

The sulfur-bearing compounds capable of converting copper to copper sulfide are vehicles to deliver sulfur to the copper surface and any material which achieves this purpose falls within the scope of the invention. Some examples to better describe the invention but in no way limit the invention are mono and dithiocarbamates, thioacids, ash and ashless dithiophosphates as while as a variety of other sulfur bearing phosphorous materials, inorganic sulfides, organic sulfides and organometallic sulfides. The tern sulfide embraces the class of sulfides and can be a mono, di,or polysulfide.

Preferably, CMP slurries of this invention generally comprise at least one soluble or partially disulfide or polysulfide. A variety of disulfide or polysulfides may be introduced as:

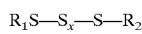

$$R_1S-S_x-S-R_2$$

wherein $R_1$ and $R_2$ are independently an organic or inorganic functional group.

The organic moieties may include hydrocarbons or functional groups such as hydrogen, amines, hydroxyl, carboxyl, halogen, sulfonyl, alkyl, aryl, alkaryl or combinations thereof. Inorganic functional groups may include alkali or alkaline earth metal salts or or ammonium salts or combinations thereof. The rank of the polysulfide, the average x in the above structure, may vary from zero to twenty-four. The preferred polysulfide is hydroethylpolysulfide.

The sulfur-bearing compounds capable of converting copper to copper sulfide may be suitably present in a wide concentration range. Preferably, the sulfur-bearing compounds capable of converting copper to copper sulfide concentration is maintained at such concentrations to effectively maintain the active sulfide at the desired concentration for copper sulfide promotion and assist in precipitation of the removed copper. Preferably, the sulfur-bearing compounds capable of converting copper to copper sulfide compositions have a concentration range from about 0.0010% to about 100%, more preferably from about 0.5% to about 75% and still more preferably from about 1.0% to about 50%.

In addition to the sulfur-bearing compounds capable of converting copper to copper sulfide, the CMP slurry may contain an oxidizing agent to promote copper removal.

Suitable chemical oxidizing agents, if used, include hydrogen peroxide, cupric chloride; persulfates of ammonium, sodium and potassium; ferric chloride; potassium ferricyanide; nitric acid, potassium nitrate, ammonium molybdate potassium iodate, hydroxylamine, diethylhydroxylamine, OXONE, transition metal complexes such as ferricyanide, ammonium ferric EDTA, ammonium ferric citrate, ferric citrate, ammonium ferric oxalate and combinations thereof.

The concentration of the oxidizing agent in deionized water may range from about 0.01 to 50% by weight, preferably 0.02 to 40% by weight. Where hydrogen peroxide is used as the oxidizing agent, it is typically present in an aqueous solution at a concentration (weight percentage) within the range from about 0.01% to about 15%, preferably from about 0.5% to about 7.5% and most preferably from about 1.0% to about 5.0%.

The CMP slurry can also contain additives such as a polishing particles, a primary and secondary buffer, chelating agents, passivating agents, surfactants, emulsifying agents, viscosity modifiers, wetting agents, lubricants, soaps, an organic or inorganic co-solvent and the like.

The optional polishing particles may be inorganic or organic abrasive particles. These abrasive particulates may be used to increase the removal rate of the copper metal and/or the dielectric. Examples of such inorganic particulates include: $SiO_2$, $Al_2O_3$, $CeO_2$, zirconia, calcium carbonate, cerium salts, garnet, silicates and titanium dioxide. The average particle size of these inorganic particulates should be less than about 1,000 Angstroms, preferably less than about 500 Angstroms and more preferably less than about 250 Angstroms.

Preferably, the working slurry contains less than 10% by weight, preferably less than 1% by weight and more preferably less than 0.5% by weight inorganic particulates.

Although abrasive particles may be added to the CMP slurry, CMP processes utilizing three-dimensional abrasive particles may be fixed to an abrasive polishing pad will preferably provide for substantially abrasive-free slurry.

Moreover, the polishing of wafers in this invention may involve no polishing particles, either in the slurry of this invention or fixed to the polishing pad.

The slurry of this invention may also contain a buffering agent. Buffers may be added to the working polysulfide slurry to assist in pH-control. As mentioned above, the pH can have a significant effect on the nature of the copper surface, and the copper removal rate. The most preferred buffers are compatible with semiconductor, post-CMP cleaning needs as well as having reduced potential impurities such as alkali metals. In addition, the most preferred buffers could be adjusted to span the pH range from acidic to near-neutral to basic. Mono, di and polyprotic acids may act as buffers, and when fully or partially de-protonated with bases such as ammonium hydroxide. Ammonium salts of the acids are preferred but other alkali and alkaline earth metal salts of the carboxylic acids may be used. Representative examples include salts of carboxylic acids include, for example, mono-carboxylic acids, di-carboxylic acids, tri-carboxylic acids, and poly-carboxylic acids. Preferred containing compounds include, for example, malonic acid, oxalic acid, citric acid, tartaric acid, succinic acid, malic acid, adipic acid, salts thereof, and mixtures thereof. Nitrogen containing compounds that may buffer the slurry include: aspartic acid, glutamic acid, histidine, lysine, arginine, ornithine, cysteine, tyrosine, and camosine, Bis(2-hydroxyethyl)iminotris(hydroxymethyl)methane, Tris (hydroxymethyl)aminomethane. N-(2-Acetamido)-2-iminodiacetic acid, 1,3-Bis[tris(hydroxymethyl) methylamino]propane, triethanolamine, N-Tris (hydroxymethyl)methylglycine, N,N-Bis(2-hydroxyethyl)g lycine and glycine. Ammonium hydrogen phosphate may also be used in the slurry of the invention.

The pH range may vary from about 2 to about 13, preferably from about 3 to 12 and most preferably from about 4 to 11.

The slurry of this invention may also comprise a copper-chelating agent. Copper removal from the wafer surface may be enhanced with the use of a complexing or chelating agent in the CMP slurry of the invention. The oxidation and dissolution of copper is enhanced by the addition of complexing agents that bond to copper to increase the solubility of dissolved copper metal or copper oxides in the organic or aqueous medium.

In the working slurries of the present invention, the complexing agent is always present at a concentration from about 0.01 to 50% by weight. During the planarization of copper; the preferred complexing agents acids or salts of: citric, iminodiacetic, 2-aminoethyl phosphonic acid, aminotri(methylenephosphonic acid) 1-hydroxyethylidene-1, 1-phosphonic acid and diethylenetri-aminepenta (methylenephosphonic acid), and glycine. The concentration of the chelating agents in the slurry may range from 0.001% to about 50% by weight, preferably from 0.5% to about 10% by weight and most preferably from 1% to about 10% by weight.

The slurry of this invention may also comprise a passivating agent (i.e., corrosion inhibitor). Corrosion inhibitors or passivating agents are well known for copper. Copper is known to be somewhat passivated by cuprous oxide, especially at neutral or mildly alkaline pH. The addition of passivating agent to the working slurry may protect areas of a copper surface not yet in contact with the abrasive article from premature, excessive removal by the oxidizing agent or control the concentration of the oxidizing agent reacting with the exposed metal surface. The best-known and most widely used inhibitors for copper are tolyltriazole, mercaptobenzothiazole and benzotriazole and their derivatives known as azole derivatives.

The amount and type of passivating agent will depend in part of the desired planarization criteria (removal rate, surface finish and planarity). The preferred concentration in the working slurry (weight percentage) is within the range between about 0.025% and about 0.20%, preferably between about 0.050% and about 0.15% and more preferably between about 0.050% and about 0.10%.

The slurry of the invention may also comprise viscosity modifiers to achieve a desired viscocity of about 5 centipoise to about 25 centipoise. Examples of viscosity modifiers include polyox™ available from Union Carbide and Carpool™ available from B.F. Goodrich. Those skilled in the art will appreciate that surfactants, viscosity modifiers and other known additives may be added to the working slurry as may be required in a particular application.

The slurry of the invention containing may also comprise a stopping compound that inhibits the ability of the system to polish at least a portion of one or more layers of a multi-layer substrate. Suitable stopping compounds adsorb to the first metal layer, the second layer, and/or one or more additional layers of a multi-layer substrate and at least partially inhibit the removal of the layer(s) by the slurry of the present invention. Preferably, the stopping compound at least partially inhibits the removal of the second layer by the slurry. The term "at least partially inhibits" as used herein means that the system has a polishing selectivity of the first metal layer:second layer of at least about 10:1, preferably at least about 30:1, more preferably at least about 50:1, and most preferably at least about 100:1. The stopping compound can be any suitable cationically charged nitrogen-containing compound selected from the group of compounds comprising amines, imines, amides, imides, polymers thereof, and mixtures thereof. Suitable stopping compounds also include, for example, cationically charged nitrogen-containing compounds selected from the group of compounds comprising amines, imines, amides, imides, polymers thereof, and mixtures thereof, wherein the stopping compound is not a sulfur-containing compound or an azole compound. Cationically charged as used herein means that a fraction (e.g., >1%) of the stopping compound is protonated at the operating pH of the system of the present invention. Preferred stopping compounds also are oppositely charged from the surface charge of the metallic layer that is not to be polished.

The slurry of the invention may contain various co-solvent to assist in solubilizing sulfur-bearing compounds capable of converting copper to copper sulfide. The solvent may be entirely water or entirely organic depending upon the composition of the sulfur-bearing compounds capable of converting copper to copper sulfide. Mixtures of water and an appropriate organic solvent may also be used within the scope of the invention. Suitable organic solvents include methanol, ethanol, isopropanol, tetrahydrofuran, dimethylsulfoxide, acetonitrile, dimethylformamide, n-methylpyrrolidin-2-one among others.

The slurry of the invention may contain various emulsifying agents.

The slurry of the invention can be used from about 10° C. to about 70° C., more preferably from about 15° C. to about 60° C. and most preferably from about 20° C. to about 50° C.

The method of present invention for modifying a surface of a wafer suited for fabrication of a semiconductor device comprises the steps of:

a. providing a wafer comprising a first material having a surface etched to form a pattern and a second material deposited over the surface of the first material;

b. contacting the second material of the wafer with slurry of the invention used in conjunction with a polishing pad, the slurry comprising a plurality of loose abrasive particles dispersed in the slurry; and c. relatively moving the wafer while the slurry and polishing pad are in contact with the exposed surface of the wafer until the wafer is planar and comprises at least one area of exposed first material and one area of exposed second material.

The method is preferably directed to modifying intermediate surfaces of a structured wafer. The first material is typically a dielectric material with an intermediate material or adhesion/barrier layer applied thereover. Some suitable intermediate materials or adhesion barrier layers include tantalum, titanium, tantalum nitride, titanium nitride. Other suitable intermediate materials or adhesion/barrier layers include metals, nitrides, and silicides. The designs associated with the first material include patterned areas, grooved areas, and vias, as well as other structures that make up a completed semiconductor device. The second material is typically a conductive material selected from titanium, silver, aluminum, tungsten, copper, or alloys thereof. The present method is particularly adapted to modifying conductive surfaces of materials having resistivity values typically less than about 0.1 ohm-cm. In general, preferred dielectric materials will have dielectric constants less than about 5.

In this aspect, the working slurry containing sulfur-bearing compounds capable of converting copper to copper sulfide and optionally the inorganic particles is as described above.

The movement between the wafer and the polishing pad occurs under pressure in the general range from about 0.1 to about 25 psi, preferably under in a range from about 0.2 to about 15 psi and most preferably in a range from about 1 to about 6 psi. The wafer and polishing pad may be rotated and/or moved against each other in a circular fashion, spiral fashion, a non-uniform manner, elliptical fashion as a figure eight or a random motion fashion. The wafer holder or the base may also oscillate or vibrate, such as by transmitting ultrasonic vibrations through the holder or base. For example, either the polishing pad or the wafer or both the polishing pad and the wafer are rotated relative to the other as well as being moved linearly along relative centers of the wafer and pad. The rotational motion or speed of rotation between the wafer and polishing pad may be between 1 rpm to 10,000 rpm. Preferred rotational speeds for the pad are at a speed between 10 rpm to 1,000 rpm, and more preferably between 10 rpm to 250 rpm and most preferably between 10 rpm to 60 rpm. Preferred rotational speeds for the wafer are between 2 rpm to 1,000 rpm, more preferably between 5 rpm to 500 rpm, and still more preferred between 10 rpm to 100 rpm.

The CMP slurries of the invention may be used without the inorganic polishing particles mixed in the aqueous medium. Rather, a fixed abrasive pad whereby a fixed three-dimensional abrasive pad having numerous abrasive particles extending throughout at least a portion of its thickness, is used such that removing some of the particles during planarization exposes additional abrasive particles capable of performing the planarization function. A preferred abrasive polishing pad comprises a plurality of abrasive particles fixed and dispersed in a binder.

In this fixed abrasive polishing method, contact and motion is maintained between the fixed abrasive pad and the wafer until an exposed surface of the wafer is planar and comprises at least one area of exposed second or conductive material and at least one area of exposed first or dielectric material, and the exposed area of conductive material and the exposed area of dielectric material lay in a single plane. The dielectric material may be covered by one or more intermediate materials such as an adhesion or barrier layer. Usually, the exposed dielectric material surface is essentially free of the intermediate material after removal of the excess conductive material. Alternatively, removal of the metal layer may expose only the surfaces of the intermediate material. Continued modification may then expose on the surface of the wafer the dielectric material and the metal layer.

The abrasive pad used with the slurries of this invention may be circular in shape, e.g., in the form of an abrasive disc. The outer edges of the circular abrasive disc are preferably smooth or, alternatively, may be scalloped. The abrasive article may also be in the form of an oval or of any polygonal shape such as triangular, square, rectangular, and the like. Alternatively, the fixed abrasive pad may be In the form of a belt or in the form of a roll, typically referred to in the CMP polishing industry as abrasive tape rolls. Abrasive tape rolls may be indexed during the modification process. The abrasive article may be perforated to provide openings through the abrasive coating and/or the backing to permit the passage of the slurry medium before, during or after use.

The interface pressure between the abrasive article and wafer surface (i.e., the contact pressure) is typically less than about 30 pounds per square inch (psi), preferably less than about 15 psi, more preferably less than about 6 psi. Also, two or more processing conditions within a planarization process may be used. For example, a first processing segment may comprise a higher interface pressure than a second processing segment. Rotation and translational speeds of the wafer and/or the abrasive pad also may be varied during the planarization process.

Recessed portions of the abrasive pad may act as channels to help distribute the working slurry over the entire wafer surface. The recessed portions may also act as channels to help remove the worn abrasive metallic sulfide particles and other debris from the wafer and abrasive article interface. The recessed portions may also prevent the phenomenon known in the art as "stiction" where the abrasive article tends to stick to or become lodged against the wafer surface.

Methods directed toward producing uniform wear rates across the surface of the object being polished and or across the surface of the polishing pad are discussed in U.S. Pat. Nos. 5,177,908; 5,234,867; 5,297,364; 5,486,129; 5,230,184; 5,245,790; and 5,562,530. These methods may be adapted for use in the present invention. Variations of the wafer planarization process which employ either a continuous belt or a supply roll of sheet pad material in conjunction with a slurry may also be employed by substituting a belt or roll of textured, three-dimensional abrasive composite and working slurry of this invention.

The amount of the working slurry of the invention applied to the wafer surface is preferably sufficient to aid in the removal of copper or copper oxide layer from the surface. In most cases, there is sufficient slurry from the working slurry of the invention. It will also be appreciated that some planarization applications may require that a second slurry be present at the planarization interface in addition to the slurry of this invention. This second slurry may be the same as the first slurry, or it may be different. The flow rate for dispersing the working slurry typically ranges from about 10 to 1,000 milliliters/minute, preferably 10 to 500 milliliters/minute, and more preferably between about 25 to 250 milliliters/minute.

The surface finish of the wafer may be evaluated by known methods. One preferred method is to measure the Rt value of the wafer surface that provides a measure of "roughness" and may indicate scratches or other surface defects. The wafer surface is preferably modified to yield an Rt value of no greater than about 1000 Angstroms, more preferably no greater than about 100 Angstroms, and even more preferably no greater than about 50 Angstroms.

There can be numerous process steps for a single semiconductor wafer. Therefore, a relatively high removal rate of metal layer is desired. With the CMP slurry of the invention described herein, the removal rate will typically be at least 1000 Angstroms per minute, preferably at least 2000 Angstroms per minute, more preferably al least 3000 Angstroms per minute, and most preferably at least 4000 Angstroms per minute. The removal rate of the metal may vary depending upon the GMP tool and the type of wafer surface being processed. Although it is generally desirable to have a high removal rate, the removal rate preferably will not be so high as to compromise the desired surface finish and/or topography of the wafer surface or make the control of the planarization process difficult.

EXAMPLES

The invention is further illustrated in the non-limiting examples set forth below.

Example 1

This example shows the effectiveness of an organic polysulfide solution in promoting copper removal from semiconductor wafers. Copper wafers were polished to using a hydroxyethylpolysulfide (HEPS) solution with a nominal 4.5 sulfur rank. The HEPS was dissolved in ethanol. One part of the HEPS solution was added to three parts of a 1:1 mixture of ethanol:water. A 4 inch copper wafer was rotated at 80 RPM (or 0.62 meter per sec relative pad-water velocity) using a wafer pressure of 3 PSI (or 20684 Pa). The polishing pad was a Rodel Ic-1000 perforated pad. The HEPS slurry flow rate was 80 cc per minutes at the center of pad. The copper removal rate was 114.4 nanometers/minute.

Example 2

Pure copper foil was cut into coupons approximately 4 cm by 4 cm. The copper was cleaned cathodically at 4.0 V in a solution containing 50 g/l sodium hydroxide at 60° C. for 30 seconds. After cleaning, the copper foil was rinsed in distilled water then immersed in 5% sulfuric acid for 5 second. The copper was again rinsed in distilled water.

The copper was immersed in a hydroxyethylpolysulfide (HEPS) solution (50:50 in ethanol with a nominal sulfur level of 4.7, pH 7, from 5 to 30 minutes. The changes in weight due to the formation of the polysulfide film are shown in the following table.

| Minutes | Initial Wt. | Final Weight | Difference Wt. | Percent Weight Gain |
|---|---|---|---|---|
| 5 | 0.1134 | 0.1153 | 0.0019 | 1.68% |
| 10 | 0.108 | 0.1173 | 0.0093 | 8.61% |
| 15 | 0.133 | 0.15 | 0.017 | 12.78% |
| 20 | 0.149 | 0.1703 | 0.0213 | 14.30% |
| 25 | 0.1191 | 0.1426 | 0.0235 | 19.73% |
| 30 | 0.1069 | 0.1362 | 0.0293 | 27.41% |

The copper gained weight and all samples were dark after removal from the polysulfide solution. The increase in weight after immersion was due to the formation of a copper(II) sulfide coating.

Example 3

The samples in Example 2 above were immersed in distilled water for 5 minutes and the polysulfide film was then removed by wiping the copper foils in cheesecloth. The foils were then re-weighed and the loss of copper due to the abraded copper sulfide is shown in the following table:

| Minutes | Initial Wt. | Final Weight | Difference Wt. | Percent Weight Loss |
|---|---|---|---|---|
| 5 | 0.1134 | 0.1112 | −0.0022 | −1.94% |
| 10 | 0.108 | 0.1021 | −0.0059 | −5.46% |
| 15 | 0.133 | 0.1234 | −0.0096 | −7.22% |
| 20 | 0.149 | 0.1368 | −0.0122 | −8.19% |
| 25 | 0.1191 | 0.105 | −0.0141 | −11.84% |
| 30 | 0.1069 | 0.0917 | −0.0152 | −14.22% |

Example 4

This example shows the effects of pH changes in the polysulfide slurry. The copper foil was cleaned as discussed in example 1 above. The copper was immersed in a hydroxyethylpolysulfide solution (50:50 in ethanol) with a nominal sulfur level of 4.7, pH 5.3, from 5 to 30 minutes. The changes in weight due to the formation of the polysulfide film are following table.

| Minutes | Initial Wt. | Final Weight | Difference Wt. | Percent Weight Gain |
|---|---|---|---|---|
| 5 | 0.0982 | 0.0986 | 0.0004 | 0.41% |
| 10 | 0.1072 | 0.1107 | 0.0035 | 3.26% |
| 15 | 0.1413 | 0.1484 | 0.0071 | 5.02% |
| 20 | 0.122 | 0.1329 | 0.0109 | 8.93% |
| 25 | 0.1355 | 0.1523 | 0.0168 | 12.40% |
| 30 | 0.1073 | 0.1258 | 0.0185 | 17.24% |

The copper gained weight and all samples were dark after removal from the polysulfide solution. The increase in weight after immersion was due to the formation of a copper(II) sulfide coating.

The copper sulfide layer was removed as discussed in Example 3 and the copper was re-weighed. The loss in copper weight is due to the removal of the copper sulfide layer.

| Minutes | Initial Wt. | Final Weight | Difference Wt. | Percent Weight Loss |
|---|---|---|---|---|
| 5 | 0.0982 | 0.0979 | −0.0003 | −0.31% |
| 10 | 0.1072 | 0.1059 | −0.0013 | −1.21% |
| 15 | 0.1413 | 0.1381 | −0.0032 | −2.26% |
| 20 | 0.122 | 0.12 | −0.002 | −1.64% |
| 25 | 0.1355 | 0.1326 | −0.0029 | −2.14% |
| 30 | 0.1073 | 0.1031 | −0.0042 | −3.91% |

The loss in copper is less at the lower pH.

Example 5

This example shows the effects of a co-solvent on copper removal rates. The copper foil was cleaned as discussed in example 1 above. A hydroxyethylpolysulfide solution (50:50 in ethanol) with a nominal sulfur level of 4.7, pH 7, was diluted in water with the HEPS concentration at 1%. The copper was immersed from 5 to 15 minutes. The changes in weight due to the formation of the polysulfide film are shown in the following table.

| Minutes | Initial Wt. | Final Weight | Difference Wt. | Percent Weight Gain |
|---|---|---|---|---|
| 1 | 0.1424 | 0.1452 | 0.0028 | 1.97% |
| 5 | 0.1430 | 0.1565 | 0.0135 | 9.44% |
| 15 | 0.1484 | 0.1603 | 0.0119 | 8.02% |

The copper sulfide layer was removed and the weight loss due to the sulfide layer is following table:

| Minutes | Initial Wt. | Final Weight | Difference Wt. |
|---|---|---|---|
| 1 | 0.1424 | 0.1416 | −0.0008 |
| 5 | 0.1430 | 0.1421 | −0.0009 |
| 15 | 0.1484 | 0.1469 | −0.0015 |

Example 6

This is another example of using a mixed organic-aqueous solvent system. The copper foil was cleaned as discussed in example 1 above. A hydroxyethylpolysulfide solution (50:50 in ethanol) with a nominal sulfur level of 4.7, pH 7, was diluted in water with the HEPS concentration 25%. The copper was immersed from 5 to 15 minutes. The changes in weight due to the formation of the polysulfide film are shown in the following table.

| Minutes | Initial Wt. | Final Weight | Difference Wt. | Percent Weight Gain |
|---|---|---|---|---|
| 1 | 0.1415 | 0.1463 | 0.0048 | 3.39% |
| 5 | 0.1339 | 0.1365 | 0.0026 | 1.94% |
| 15 | 0.1459 | 0.1498 | 0.0039 | 2.67% |

The copper sulfide layer was removed as discussed in example 2 and the copper was re-weighed. The loss in copper weight is due to the removal of the copper sulfide layer.

| Minutes | Initial Wt. | Final Weight | Difference Wt. | Percent Weight Loss |
|---|---|---|---|---|
| 1 | 0.1415 | 0.1404 | −0.0011 | −0.78% |
| 5 | 0.1339 | 0.1306 | −0.0033 | −2.46% |
| 15 | 0.1459 | 0.1399 | −0.006 | −4.11% |

Example 7

This example shows the use of a polysulfide in a completely aqueous medium. The copper foil was cleaned as discussed in example 1 above. The copper was immersed in a thioglycolic acid polysulfide solution, 40% in water with a nominal sulfur level of 4.7, pH 5.3, from 5 to 30 minutes. The changes in weight due to the formation of the polysulfide film are shown in the following table. The copper sulfide was rinsed and removed as discussed in example 2. The copper loss a considerable fraction of its original weight due to the formation of the polysulfide layer.

| Minutes | Initial Wt. | Final Weight | Difference Wt. | Percent Weight Loss |
|---|---|---|---|---|
| 5 | 0.1375 | 0.0858 | −0.0517 | −37.60% |
| 10 | 0.1199 | 0.0809 | −0.039 | −32.53% |
| 15 | 0.1408 | 0.0945 | −0.0463 | −32.88% |
| 20 | 0.1276 | 0.0855 | −0.0421 | −32.99% |
| 25 | 0.1436 | 0.0873 | −0.0563 | −39.21% |
| 30 | 0.1395 | 0.0734 | −0.0661 | −47.38% |

What is claimed is:

1. A slurry useful in planarizing a surface of a wafer suited for fabrication of a semiconductor device, the slurry being comprised of:
   a) sulfur-bearing compounds capable of converting copper to copper sulfide,
   b) optionally, a liquid carrier,
   c) optionally, an oxidizing agent,
   d) optionally, inorganic polishing particles,
   e) optionally, a chelating agent,
   f) optionally, a buffering agent,
   g) optionally, a passivating agent,
   h) optionally, surfactants, emulsifying agents, viscosity modifiers, wetting agents, lubricants, soaps, and the like,
   i) optionally a stopping compound to increase metal polishing selectively, and
   j) optionally, a co-solvent.

2. The slurry of claim 1 wherein the sulfur-bearing compound capable of converting copper to copper sulfide is a disulfide or polysulfide having the structure:

$$R_1-S-S_x-S-R_2$$

wherein $R_1$ and $R_2$ are independently an organic or inorganic moiety and x is an integer from 0 to 24.

3. The slurry of claim 2 wherein $R_1$ and $R_2$ are independently an organic moiety that may include hydrocarbons or functional groups such as a hydrogen, amines, hydroxyl, carboxyl, halogen, sulfonyl, alkyl, aryl, alkaryl or combinations thereof.

4. The slurry of claim 2 wherein $R_1$ and $R_2$ are independently an inorganic functional group selected from an alkali or alkaline earth metal salts or ammonium salts or combinations thereof.

5. The slurry of claim 2 wherein the polysulfide is hydroxyethylpolysulfide.

6. The slurry of claim 1 wherein the sulfur-bearing compounds capable of converting copper to copper sulfide has a concentration from 0.0010% to 100%.

7. The slurry of claim 1, wherein the inorganic polishing particles are selected from $SiO_2$, $Al_2O_3$, $CeO_2$, zirconia, calcium carbonate, cerium salts, garnet, silicates and titanium dioxide.

8. The slurry of claim 1 wherein the pH is between 2 to 13.

9. A method of modifying a surface of a wafer suited for the fabrication of a semiconductor device comprising the steps of:
  a) providing a wafer comprising a first material having a surface etched to form a pattern and a second material deposited over the surface of the first material;
  b) contacting the second material of the wafer with polishing pad in the presence of the working slurry containing a sulfur-bearing compound capable of converting copper to copper sulfide; and
  c) relatively moving the wafer or polishing pad while the second material is in contact with a polishing pad until an exposed surface of the wafer is planar and comprises at least one area of exposed first material and one area of exposed second material.

10. The method of claim 9 wherein the slurry contains polishing particles.

11. The method of claim 9 wherein the polishing particles are fixed on the polishing pad.

12. The method of claim 9 wherein the polishing pad comprises a slurry and a polymer pad, the slurry comprising a plurality of loose abrasive particles dispersed in a slurry, the slurry contacting the metal layer of the wafer by the application of the polishing pad.

13. The method of claim 12 wherein the first material is a dielectric material and the second material is a conductive material.

14. The method of claim 12, wherein the wafer further comprises a barrier layer covering the dielectric material.

15. The method of claim 12, wherein the metal layer is a conductive metal selected from the group consisting of titanium, silver, aluminum, tungsten, tantalum, tantalum nitride, tungsten nitride, tantalum oxide, tungsten oxide, silica, copper, or alloys thereof.

16. The method of claim 12 wherein high impingement water is used to remove the abraded copper sulfide particles.

17. The method of claim 12 wherein ultrasonic radiation is used to assist in copper sulfide removal from the wafer surface.

* * * * *